United States Patent [19]

Schutz

[11] Patent Number: 4,784,719

[45] Date of Patent: Nov. 15, 1988

[54] DRY ETCHING PROCEDURE

[75] Inventor: Ronald J. Schutz, Warren, N.J.

[73] Assignee: American Telephone and Telegraph Company, AT&T Bell Laboratories, Murray Hill, N.J.

[21] Appl. No.: 144,761

[22] Filed: Jan. 19, 1988

Related U.S. Application Data

[63] Continuation of Ser. No. 750,084, Jun. 28, 1985, abandoned.

[51] Int. Cl.4 .................. H01L 21/306; B44C 1/22; C03C 15/00; C03C 25/06
[52] U.S. Cl. .................................. 156/643; 156/646; 156/657; 156/659.1; 156/662; 156/649; 156/648; 204/192.37; 252/79.1; 437/225; 427/38
[58] Field of Search ............ 156/643, 646, 657, 659.1, 156/662, 649, 648; 204/192.37; 427/38, 39; 252/79.1; 437/225; 430/313, 314

[56] References Cited

U.S. PATENT DOCUMENTS

| | | | |
|---|---|---|---|
| 4,208,241 | 6/1980 | Harshbarger et al. | 156/657 |
| 4,446,613 | 5/1984 | Beinglass et al. | 156/648 |
| 4,471,525 | 9/1984 | Sasaki | 156/643 |
| 4,484,979 | 11/1984 | Stocker | 156/651 |
| 4,542,577 | 9/1985 | Jackson | 156/651 |
| 4,561,907 | 12/1985 | Raicu | 156/643 |

Primary Examiner—William A. Powell
Attorney, Agent, or Firm—Bruce S. Schneider

[57] ABSTRACT

The presence of material deposited on the sidewall during device fabrication utilizing plasma-effected etching of semiconductor materials has significant consequences in the properties of these devices. It has been found that such depositions lead to a sidewall slope that, among other things, in turn produces linewidth loss. Additionally, the presence of a sloped masking material, e.g., a photoresist or sidewall deposit, produces further undesirable results.

12 Claims, 3 Drawing Sheets

DRY ETCHING PROCEDURE

This application is a continuation of application Ser. No. 750,084, filed June 28, 1985, now abandoned.

BACKGROUND OF THE INVENTION

1. Field of the Invention

This invention relates to semiconductor device processing and, in particular, to semiconductor device processing involving etching.

2. Art Background

Semiconductor devices are generally fabricated on a substrate through a series of processing steps including deposition of semiconductor materials, metals, insulators, and the etching of these materials in selected patterns. In one common etching method, a reactive etchant species is generated in a plasma and directed at a high velocity by an electric field towards the material to be etched. Generally during etching, the material being etched is masked in selected regions from this reactive species by a composition such as a polymer (typically denominated a resist) that has been delineated in a desired pattern. Thus, the pattern of the resist is transferred during the etching process to the underlying etched material. As a result, the device configurations desired in semiconductor, insulator, and/or metal regions are produced.

Accelerated reactive species are advantageously utilized in etching because they typically produce anisotropic etching, i.e., etching where the etch rate at any point along the etch pit wall in the direction of etchant species momentum is at least ten times greater than the etch rate in the direction normal to this velocity vector. Two effects generally contribute to the attainment of anisotropic etching. In one circumstance, a material to be etched, such as silicon, reacts with certain species, e.g., $Cl^+$, only when the species has significantly higher momentum than that associated with room temperature. Thus, when such a species is accelerated essentially perpendicularly to the substrate surface, etching preferentially occurs in this direction rather than the remaining random directions associated with etchant species which are only thermally activated. In a second circumstance, such as in the etching of aluminum by species generated in a $Cl_2/C_2F_6$ plasma, material which is resistant to isotropic etching is produced during the etching process, is redeposited on the sidewalls of the etch void, and promotes anisotropic etching. (See U.S. Pat. No. 4,208,241, issued June 17, 1980, where a recombinant species forms such a resistant material.) That is, the redeposited material acts as an etch mask.

The attainment of anisotropic etching through one or both of these mechanisms is significant because it promotes maintenance of the unetched region dimensions (frequently called linewidth control), facilitates subsequent processing, and allows lines to be closely spaced. For example, when isotropic etching, i.e., a lateral etch rate that is at least one-tenth of the etch rate in the etchant momentum direction, rather than anisotropic etching is achieved, etch profiles, 14, such as those shown in FIG. 1 are produced utilizing a resist, 15. Obviously, the attainment of isotropic rather than anisotropic etching reduces linewidth control, i.e., the percentage between 1) the largest deviation of any feature from the corresponding desired feature, 12, defined by the mask at the substrate surface and 2) one-half the linewidth, 12, defined by the mask. (A feature deviation is thus the distance from any point on an etch sidewall measured perpendicularly to a surface extending from the extremities of the mask region defining this feature in a direction perpendicular to the surface at each point along the mask extremity.) Similarly, linewidth control is also compromised, as shown in FIG. 2 where 15 indicates the resist, if the sidewalls slope in the opposite direction. Configurations such as those shown in FIGS. 1 and 2 are undesirable because they interfere with subsequent processing as well as contributing to loss of linewidth control. For example, it the etched line is itself to be used as a mask, e.g., for an ion implantation mask, any linewidth gain or loss augments the associated inaccuracies in subsequent mask use. Alternatively, if an insulating layer is to be formed on the etch sidewalls by deposition onto all surfaces followed by an anisotropic etch to remove the material from lateral surfaces, then the tapered profile in FIGS. 1 and 2 will compromise the insulating layer on the sidewall during the anisotropic etch.

Although sidewall redeposition during etching has been associated in many circumstances with the maintenance of anisotropic etching, it does present some difficulties. As discussed by Kinsbron, Levinstein, and Willenbrock in U.S. Pat. No. 4,343,677, issued Aug. 10, 1982, it is desirable to remove these sidewall redeposits because (1) they tend to be dislodged during subsequent processing, (2) they often assume undesirable shapes, and (3) they frequently have undesirable electrical or mechanical properties. Sidewall redeposition also does not always ensure anisotropy. Despite the occurrence of sidewall redeposition and the use of energetic reactive species, anomalous etching patterns such as shown at 16 in FIG. 3 (where 15 is the resist) have been observed. These anomalies are generally undesirable because they degrade feature mechanical stability and conductivity.

SUMMARY OF THE INVENTION

The presence of sidewall redeposits has a significant, previously unrecognized effect beyond that of resistance to the etchant species. In particular, the greater the amount of sidewall redeposition, the greater the slope of the sidewall after the redeposited mask material is removed. It has also been found that the amount of this redeposition is critically dependent on the local feature geometry surrounding the sidewall. Thus, in circumstances where linewidth control is critical, such as in circumstances where etch features critically control device parameters, e.g., the gate length in a field effect transistor, local compensation should be made for redeposition onto etch sidewalls. For example, the resist mask should be appropriately adjusted in local regions of excess redeposition, or feature geometry should be adjusted in these regions.

Linewidth control is also affected by other previously unrecognized effects. To protect linewidth and ensure acceptable etch rates, a mask material surface (including the surface of redeposited material that contributes to the attainment of anisotropy) should be carefully adjusted. If the configuration of the redeposited material is controlled, anomalous etching effects, such as shown in FIG. 3, and anomalously slow etch rates are avoided. The profile of the resist mask also affects the configuration of the sidewall, i.e., the etch pit boundary after the redeposition is removed. If the portion of the resist defining the etch pattern presents a surface forming an excessive angle with the momentum direction of the reactive species, linewidth control is unacceptably degraded. All these effects become particularly important when linewidth control of 0.1µ or better is desired.

DETAILED DESCRIPTION

Figure 4:
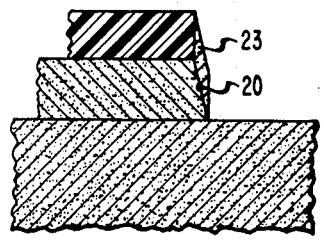
FIGS. 4 and 5 illustrate possible configurations of redeposition.
Figure 5:
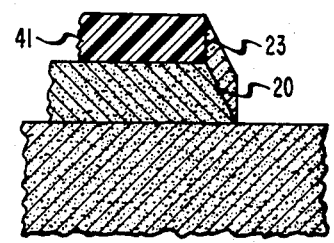

It has been found that important etching properties, such as etching speed and linewidth, depend strongly on the redeposition process. A first prime consideration is the extent of redeposition. The greater the rate of redeposition onto the sidewall, the greater the slope of this sidewall. (In this context, the etch pit sidewall is the configuration of the surface of the etch pit when the redeposited material, i.e., the material added to the sidewall during etching, is removed.) If redeposition occurs, sidewall slope (deviation from the etchant species momentum direction) occurs and the extent of this slope directly depends on the magnitude of the redeposition onto the etch sidewall at the bottom of the etch pit. The effect of redeposition on etching efficacy is illustrated in FIGS. 4 and 5. If a small amount of redeposition, 23, occurs, then sidewall angles such as shown in FIG. 4 at 20 are obtained. In contrast, if a relatively large amount is redeposited, then configurations such as that shown in FIG. 5 are obtained, where the stippled region, 23, indicates the redeposited material, 20 indicates the surface of the sidewall, and 41 is the resist. As shown in FIGS. 4 and 5, as the angle of the sidewall increases, linewidth control is lost. Thus, compensation for this linewidth loss should be made. Generally, this compensation is accomplished by (1) adjusting the ligthographic process, e.g., utilizing suitably narrow lines to compensate for linewidth broadening and thus to yield the desired linewidth, and/or (2) limiting the extent of redeposition. In the second approach, the redeposition should be limited so that after etching the angle between (1) the linear least-squares-fit to the sidewall and (2) the direction of the etchant species momentum vector surface at the intersection of the least-squares-fit is sufficiently small to produce the desired linewidth control, e.g., an angle smaller than 12 degrees for a feature deviation of 0.1 µm with an etch pit depth of 0.5 µm.

The amount of redeposition, however, is not uniform across a substrate. A predominant source of redeposition is by-product species from the etched material. The angle of the sidewall, except in anomalous cases to be subsequently discussed, depends, to an excellent approximation, on the ratio between (1) the redeposition flux at the interface between the etch pit bottom and the redeposited material and (2) the etch rate of the material being etched in the direction of species momentum. The redeposition flux at the bottom of the etch pit is directly dependent on the area of the etch pit bottom. The relative geometries and configurations of the features define this area and thus strongly affect sidewall angle. As a result, redeposition depends strongly on the local geometry, and thus compensation should be tailored to this local variance.

Three geometry types are commonly involved in the formation of devices. The first case involves features having proximate sidewalls, i.e., an etch pit which has a characteristic distance and whose depth is at least as large as half of its characteristic distance. An etched void has a characteristic distance if the largest and smallest dimensions of the figure formed by the intersection of the mask with the substrate surface differ by less than 50 percent. (A dimension of a figure is the inscribed distance of a line from one point on the figure across the figure through the center of mass of the figure.) The second situation involves a trench configuration, i.e., an etched region defined by the mask (1) is bounded by two substantially parallel lines separated by not more than 7 times the etch pit depth and (2) these parallel lines are longer than 1.5 times this separation. The third case involves an open feature, i.e., the closest etch sidewall is at least greater than 7 etch pit depths away from every other sidewall forming the etch pit. (It should be noted that in one etch pit it is possible to have a portion falling within one case, e.g., case 2, and a second portion falling within a second case, e.g., case 3. For example, an etch pit with a dumbbell shape has two case 1 regions and one case 2 region.)

Figure 6:
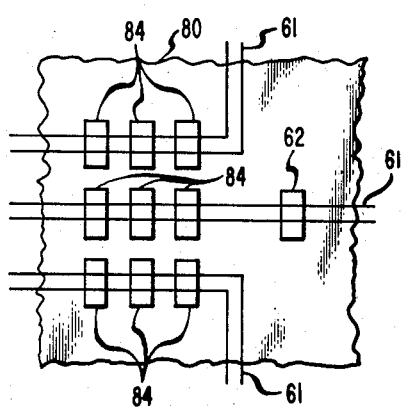
FIGS. 6 and 7 illustrate the effect of configuration on redeposition.
Figure 7:
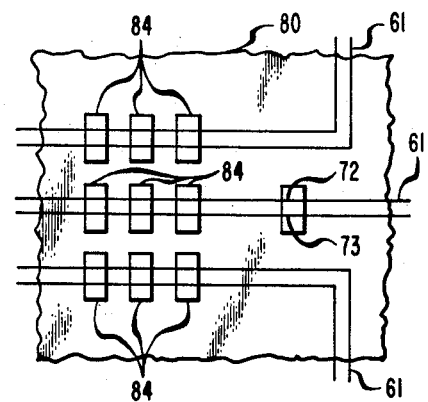

In the first and second cases, the sidewall redeposition is significantly less than in the third case because of a smaller source of redeposition flux. In the third case, the area of the etch pit bottom is the greatest, and the amount of redeposition is correspondingly large. Thus, typically, open features such as 62, shown in the plan view of FIG. 6, are preferably avoided. (In FIGS. 6 and 7, 61 is a resist that defines gates and that defines gate conductors which extend over thick field oxide, 80, and into the transistor regions, 84. Additionally, transistor regions repeating the configuration of regions, 84, have been omitted for clarity.) For example, in one embodiment, non-functional features are formed to convert case (3) situations on a substrate to case (2) configurations. In a second embodiment, this conversion is accomplished by changing one or more functional features, e.g., conductors are rerouted so they pass within a relatively short distance of the open sidewall (72 and 73 in FIG. 7). Thus, a feature is relocated from a path of least meander, i.e., the shortest distance consistent with device design between points to be electrically contracted, so that it limits the area of an etch pit bottom. The objectional local configuration is, in this way, transformed from an open configuration to a configuration within case (2). Thus, compensation is accomplished locally in regions where linewidth control is required to maintain device properties. (Locally, in this context, is compensation in at least one region, but not all regions of a plurality of regions which are designed to have the same linewidth.) A third embodiment involves locally compensating the resist mask. In this embodiment, instead of converting from one case to another, the resist mask in a localized area is modified to compensate for the sidewall variations occurring with different geometric cases. For example, in FIG. 6, the resist feature defining gate 61, over region 62, is decreased sufficiently from that of regions, 84, to compensate for the local linewidth broadening occurring in this case 3 region. This embodiment is generally less desirable since, as previously discussed, the sidewall is tapered.

As previously noted, the angle of the sidewall also depends on the substrate etch rate. Thus, an auxiliary approach to local compensation for sidewall angle is the control, irrespective of source, of the reactant species composition in the plasma. For example, silicon trenches are typically etched utilizing a $Cl_2$ based etchant gas with an organic polymer/$SiO_2$ mask. By the elimination of the polymer mask layer, the amount of redeposition is reduced, and thus the amount of sidewall angle undergoes a concomitant reduction. Thus, it is possible to utilize a change in configuration, as previously discussed, in conjunction with an appropriate modification of the etching gas chemistry to further reduce the amount of redeposition.

Anomalous situations, e.g., catastrophic isotropic etching, linewidth loss, and/or unacceptably slow etch rate, also occur. These situations are produced when material functioning as a mask (i.e., either (1) redeposited material that is acting as a barrier to lateral etching or (2) the feature-defining edge of a resist material) during etching is substantially subjected to non-glancing impact by the etchant species. (A redeposited material is considered a barrier to etching when the redeposited material does not etch isotropically.) Such undesirable contact depends upon the configuration of the mask surface. To avoid disadvantageous loss of linewidth by violating the angle criterion for the resist mask, at the inception of etching the angle formed between a tangent to the mask at the point it intersects the substrate and a perpendicular to the substrate at this point should be less than $\arctan(y^x)$, where x is the horizontal redeposition rate at this point, and y is the etch rate of the substrate. To avoid the consequences of unduly subjecting the redeposited mask material to etching, an angle should be avoided at any point on redeposited material serving to mask the sidewalls that is greater than $\arctan(z^x)$ where z is the etch rate of the redeposited material in a direction parallel to the etchant species momentum direction. (The angle of the redeposited mask at a point is the angle formed between the direction of species momentum and a tangent to the mask at this point.)

Figure 1:
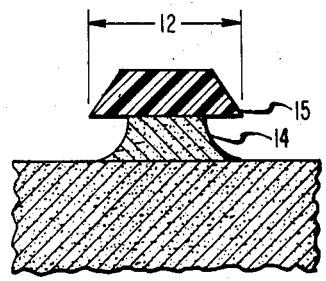
FIGS. 1-3 illustrate sidewall configurations sometimes obtained after etching.
Figure 2:
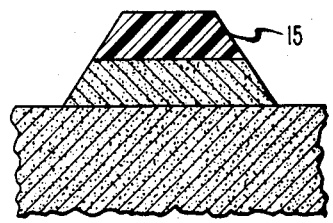
Figure 3:
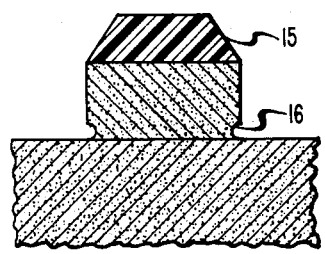
Figure 8:
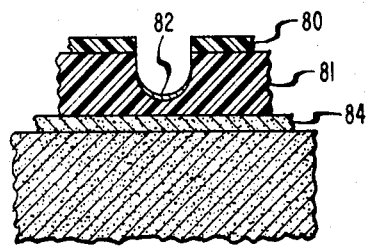
FIGS. 8-11 illustrate the effect of mask angle.

The consequence of violating the angle criterion for the resist mask is loss of linewidth control. Surprisingly, this loss occurs despite the formation of barrier redeposited material underlying the feature-defining edge of the resist mask. Thus, even in an etchant system that induces production of barrier redeposition, the resist angle criterion should be satisfied. The consequence in many circumstances of violating the angle criterion for the redeposited material is often even more severe. For example, when the angle criterion is violated at a point on the redeposited surface, a portion of the underlying sidewall is exposed. If the etchant species has a significant lateral etch rate for this exposed material, such lateral etching quickly propagates, and configurations such as those shown in FIG. 3 are obtained. If there is not a significant lateral etch rate, severe consequences are still possible. For example, the dynamic processes involved in redeposition lead, upon further etching, to curvature of an exposed sidewall, such as shown in FIG. 8, where 81 is the material being etched, 80 is the resist, and 82 is the redeposited material. Continued redeposition on this curved surface presents slowly etched materials at the etch pit bottom and thus concomitantly decreases the rate of etch pit depth propagation. This etch rate decrease correspondingly increases cost and increases the possibility of unacceptable resist mask erosion before the feature is totally delineated. Alternately, upon intersection of the etch pit with an underlying material, 84, undesirable etching of this underlying material will often continue for an unacceptable time while the slowly etched extremities of the protected etch pit bottom are removed.

To avoid these consequences, the angle of the redeposited material is controlled by controlling the amount of redeposited material formed at the bottom of the etch pit as compared to the top. Generally, to avoid a violation of the redeposited mask angle criterion, the rate of redeposition at the bottom of the etch pit should be no more than 10 times the redeposition at the top of the etch pit. Uniformities are typically attained by expedients such as changing the geometry and thus changing the redeposition rate at the bottom of the etch pit relative to the top.

Figure 9:
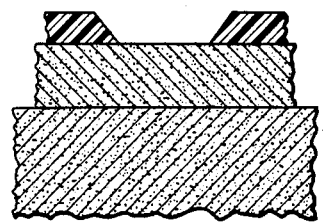
Figure 10:
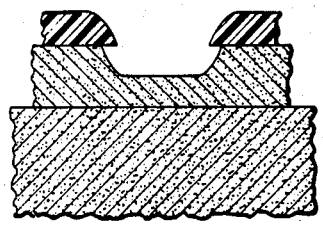
Figure 11:
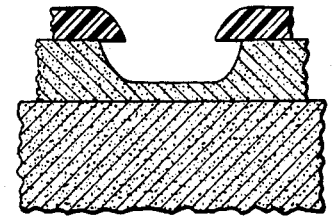

Violation of the resist mask angle criterion also results in unaccerptable consequences such as loss of linewidth control. When the resist mask angle criterion is violated, erosion occurs in a progressive series shown in FIGS. 9–11. As can be seen, material is eroded from under the mask, resulting in feature dimensions significantly smaller from those desired. An exemplary expedient for producing an essentially vertical resist wall and the desired resist mask angle control in use of a trilevel mask, such as described in U.S. Pat. No. 4,244,799, issued Jan. 13, 1981, which is hereby incorporated by reference.

The following examples are illustrative of the invention.

EXAMPLE 1

A 3 inch in diameter silicon substrate having its major surface in the (100) plane was cleaned by conventional methods. The substrate was placed on the sample holder of a tube furnace. The furnace was heated to a temperature of 700 degrees C. Tetraethylorthosilicate was introduced into the furnace at a flow rate of 20 sccm to yield a pressure of approximately 0.25 Torr. The tetraethylorthosilicate flow was continued for a sufficient time to produce a layer thickness of 3 $\mu$m. The substrate was removed from the furnace, and a 1.8 $\mu$m layer of HPR 206 resist (a proprietary product of Hunt Chemical Company, which is basically a novolak resin with a quinone diazide sensitizer) was applied utilizing spin coating at 4000 rpm. The substrate was baked at 200 degrees C. for 1 hour and was then placed, with the baked HPR layer exposed, on the grounded electrode of a radial flow parallel plate plasma apparatus. The apparatus was evacuated, and 5 percent silane in argon and nitrous oxide were introduced at a flow rate of 1.44 l/min and 1.56 l/min, respectively. The pumping speed was then adjusted to give a total pressure of 1.0 Torr. An rf discharge was struck utilizing a frequency of 13.56 MHz at a power density of approximately 0.010 W/cm$^2$. The plasma was extinguished after a silicon oxide layer of approximately 1200 Angstroms was deposited. The remaining gases were evacuated from the chamber and the substrate removed. A 7000 Angstrom thick layer of dichloropropylacrylate mixed with a copolymer was formed by spinning at a speed of 2200 rpm. The substrate was placed on the sample holder of an X-ray exposure apparatus with a palladium L$_\alpha$ source. The exposure mask had a boron nitride membrane with an overlying gold pattern. This gold pattern had uniformly spaced holes varying in diameter from 0.3 $\mu$m to 2.0 $\mu$m. The X-ray exposure was continued until a total dose of 15 mjoules/cm$^2$ was provided. The exposed resist was then developed by immersion in a mixture of isopropyl alcohol and methyl ethyl ketone to uncover a portion of underlying silicon oxide in the desired pattern. The substrate was transferred to the powered cathode of a hexagonal cathode etching apparatus. The chamber was evacuated, and CHF$_3$ was introduced at a flow rate of 60 sccm yielding a pressure of 10 mTorr. A plasma was struck utilizing an rf frequency of 13.56 MHz and a power density of approximately 0.03 W/cm$^2$. The etching was continued until the uncovered silicon oxide material was removed to uncover corresponding portions of underlying HPR. The CHF$_3$ was evacuated, and oxygen at a flow rate of 70 sccm was introduced to yield a pressure of 3 mTorr. Again, a plasma was struck at a power density of 0.08 W/cm$^2$. This etching was continued until the uncovered HPR 206 resist was removed. The chamber was evacuated, back-filled with nitrogen, and the substrate removed.

The substrate was placed on the powered cathode of a second hexagonal reactor. This reactor included silicon-coated trays which surrounded the substrates that occupied areas of the hexagonal cathode facets not occupied by the substrates. The chamber was evacuated, and CHF$_3$ was introduced at a flow rate of 30 sccm to produce a pressure of 70 mTorr. The plasma was struck utilizing an rf frequency of 13.56 MHz and a power density of 0.16 W/cm$^2$. The plasma was extinguished after a measured period of time. The chamber was again evacuated, back-filled with nitrogen, and the substrate removed. The time period utilized was sufficiently short so that etching did not proceed through the entire thickness of the silicon oxide layer underlying the HPR. The substrate was observed utilizing a scanning electron microscope. This observation was done by cleaving and polishing the substrate and measuring the etch depth associated with different diameter mask holes. It was found that there was a large variation in etch rates, depending on the mask opening. For example, etch rates of 75 Angstroms/minute were obtained for a 0.3 μm opening, etch rates of 200 Angstroms/minute were obtained for a 0.6 μm opening, and etch rates of 250 Angstroms/minute were obtained for openings of 1 μm and larger. Each etch pit additionally exhibited a rounded bottom, such as that illustrated by FIG. 8. The curvature of this bottom was significantly greater for the smaller-sized mask openings.

EXAMPLE 2

A 4 inch in diameter silicon substrate having its major surface in the (100) plane was cleaned by conventional techniques. The substrate was placed in a furnace at 950 degrees C. in an atmosphere of dry oxygen plus 2 percent HCl. The substrate was maintained under these conditions for 22 minutes to produce a 250 Angstroms thick thermal oxide layer. A region of silicon, 4000 Angstroms thick, was deposited on the thermal oxide. This deposition was accomplished by low pressure chemical vapor deposition as described in Example 1 for the silicon oxide deposition, except that undiluted silane was utilized at a pressure of 0.25 Torr. The substrate was immersed in 100:1 H$_2$O/HF, rinsed in deionized water, and dried. Arsenic ions were implanted into the substrate by exposure to arsenic ions accelerated through a potential of 60 KeV for a period sufficient to yield a total dose of 1×10$^{15}$ arsenic/cm$^2$. The substrate was placed, with the silicon layer exposed, on the sample holder of co-sputtered deposition apparatus. Magnetron sources of silicon and tantalum were utilized. These sources were controlled to yield a film whose composition had a ratio of approximately 2:1 silicon-to-tantalum. The co-deposition was continued until a layer thickness of approximately 2500 Angstroms was achieved. The substrate was removed from the co-depositing apparatus and placed in an argon ambient at 650 degrees C. for 30 minutes.

The trilevel resist, as described in Example 1, was formed utilizing a bottom layer of HPR, an intermediate layer of silicon oxide, but utilizing a 7000 Angstrom thick upper photoresist layer of Microposit 1400, manufactured by Shipley Company Inc. of Newton, Mass., which was deposited by spin coating. The upper photoresist was exposed by projection printing (projection ratio of approximately 5:1) utilizing a reticle having a pattern corresponding to the gate level of an NMOS integrated circuit. Thus, this pattern contained a series of lines that were, in some regions, closely spaced. The exposing source was a 350 watt mercury arc bulb using the 405 nm line. The exposed photo-sensitive layer was developed by immersion for 0.5 minute in Microposit 453 developer (manufactured by Shipley Company Inc.). The underlying uncovered silicon oxide and HPR layers were developed as described in Example 1.

The substrate with the delineated pattern was placed on a hexagonal reactor having polyarylate trays. The chamber was evacuated, and CCl$_3$F was introduced at a flow rate of 30 sccm to yield a partial pressure of 7 mTorr. A plasma was struck utilizing an rf frequency of 13.56 MHz and a power density of 0.03 W/cm$^2$. The plasma was extinguished after the etching had proceeded through the tantalum/silicon region and partially into the underlying silicon region. The chamber was again evacuated, and molecular chlorine gas was introduced at a flow rate of 60 sccm to yield a partial pressure of 40 mTorr. A plasma was again struck and extinguished after a time period 1.5 times greater than that necessary to remove the entire remaining silicon layer.

The substrate after cleaving was observed in a scanning electron microscope. Where sidewalls were in close proximity (case 2), cross-sectional views, as illustrated in FIG. 3, were obtained. Profiles illustrated in FIG. 5 were obtained where features were not in close proximity (case 3).

What is claimed is:

1. A process for fabricating a device comprising the steps of forming a resist mask on a substrate, etching said substrate to form a plurality of etch pits defining a plurality of features that are designed to have a desired linewidth by inducing reaction of said substrate with energetic species, and completing said device, wherein redeposition of material on the sidewalls of said etch pit occurs during said etching and wherein said process includes a step comprising locally compensating for the effect of said redeposition on the conformation of said sidewall by providing a processing environment for at least one of said features that differs from at least one of said features to aid in maintaining said linewidth.

2. The process of claim 1 wherein said feature comprises a gate of a transistor.

3. The process of claim 1 wherein said commpensation comprises adjusting the local dimension of said resist mask.

4. The process of claim 1 wherein said compensation comprises forming a non-functional feature in proximity to at least one of said features.

5. The process of claim 1 wherein said compensation comprises diverting one of said features from a route of least meander to be in proximity with a second of said features.

6. The process of claim 1 wherein said substrate comprises silicon.

7. A process for fabricating a device comprising the steps of forming a resist mask on a substrate, etching said substrate to form a plurality of etch pits defining a plurality of features by inducing reaction of said substrate with energetic species, and completing said device, wherein redeposition of material on the sidewalls of said etch pit occurs during said etching and wherein said process includes a step comprising contacting, when said redeposited material presents a barrier to isotropic etching in said substrate, said etchant species with said resist mask so that the angle formed between a) a tangent to said resist mask at the point said resist mask intersects the substrate and b) a perpendicular to said substrate at said point is less than arctan $(y^x)$, where x is the horizontal rate of said redeposition at said point and y is the etch rate of said substrate whereby the linewidth defined by said mask is essentially maintained.

8. The process of claim 7 wherein said feature comprises a gate of a transistor.

9. The process of claim 7 wherein said substrate comprises silicon.

10. A process for fabricating a device comprising the steps of forming a resist mask on a substrate, etching said substrate to form a plurality of etch pits defining a plurality of features by inducing reaction of said substrate with energetic species, and completing said device, wherein redeposition of material on the sidewalls of said etch pit occurs during said etching and wherein said process includes a step comprising limiting, when said redeposited material presents a barrier to isotropic etching in said substrate, the contact angle between the momentum direction of said etchant species and a tangent to said redeposited material at all points on said resistant redeposited material serving to mask said sidewalls so that said contact angle is less than arctan $(z^x)$, where z is the etch rate of said resistant redeposited material in a direction parallel to said etchant species momentum direction and where x is the horizontal rate of deposition at said point whereby anisotropy is maintained without an excessive decrease in etch rate.

11. The process of claim 10 wherein said feature comprises a gate of a transistor.

12. The process of claim 10 wherein said substrate comprises silicon.

* * * * *

UNITED STATES PATENT AND TRADEMARK OFFICE
CERTIFICATE OF CORRECTION

PATENT NO. : 4,784,719

DATED : November 15, 1988

INVENTOR(S) : Ronald J. Schutz

It is certified that error appears in the above-identified patent and that said Letters Patent is hereby corrected as shown below:

In the specification, column 4 lines 45 and 46 "contracted" should read --contacted--.

In column 5 line 28, "$y^x$" should read -- $\frac{x}{y}$ --.

In column 5 line 34, "$z^x$" should read -- $\frac{x}{z}$ --.

In column 6 line 16, "unaccrptable" should read --unacceptable--.

In column 6 line 23, "in use" should read --is use--.

In the claims, column 9, line 20, claim 7, "$y^x$" should read -- $\frac{x}{y}$ --.

In the claims, column 10, line 16, claim 10, "$z^x$" should read -- $\frac{x}{z}$ --.

Signed and Sealed this

Thirteenth Day of June, 1989

Attest:

DONALD J. QUIGG

Attesting Officer

Commissioner of Patents and Trademarks